United States Patent [19]

Glennon

[11] 4,243,947
[45] Jan. 6, 1981

[54] RADIO FREQUENCY AMPLIFIER WITH GAIN CONTROL

[75] Inventor: Timothy P. Glennon, Kokomo, Ind.

[73] Assignee: General Motors Corporation, Detroit, Mich.

[21] Appl. No.: 24,706

[22] Filed: Mar. 28, 1979

[51] Int. Cl.³ .......................... H03F 3/16; H03G 3/30
[52] U.S. Cl. ...................................... 330/284; 330/277; 330/285
[58] Field of Search ................ 330/145, 277, 284, 285

[56] References Cited

U.S. PATENT DOCUMENTS

| | | | |
|---|---|---|---|
| 3,110,869 | 11/1963 | Smith-Vaniz et al. | 330/285 |
| 3,634,775 | 1/1972 | Ulmer et al. | 330/284 |
| 4,019,160 | 4/1977 | Kam | 330/145 X |

*Primary Examiner*—James B. Mullins
*Attorney, Agent, or Firm*—Robert M. Sigler

[57] ABSTRACT

A common gate field effect transistor amplifier has a source bias resistor effective to establish source bias voltage near pinch-off. A current source is connected through a diode having a dynamic RF impedance which varies inversely with direct current therethrough to the source of the field effect transistor. An increase in current from the current source in response to a change in an automatic gain control voltage causes increased current flow through the diode and consequently through the bias resistor to increase source voltage and thus reduce amplifier gain. The same increase of current through the diode reduces its dynamic RF signal impedance and allows shunt of RF signal therethrough and through a shunting capacitor to ground to further decrease gain of the amplifier and improve its overload characteristics.

2 Claims, 1 Drawing Figure

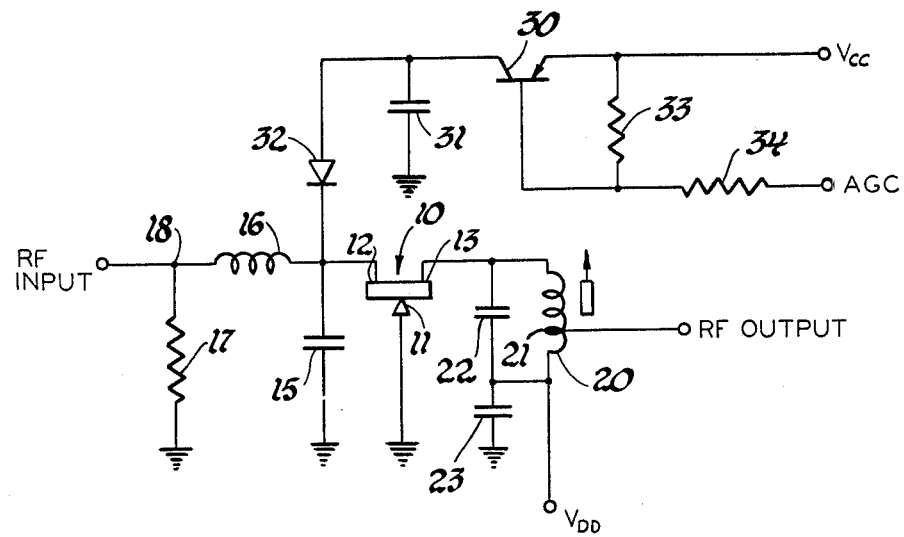

RADIO FREQUENCY AMPLIFIER WITH GAIN CONTROL

BACKGROUND OF THE INVENTION

This invention relates to radio frequency amplifiers with gain control, and particularly to such amplifiers using field effect transistors. There are many methods of gain control in radio frequency amplifiers that are known in the prior art. The amplifier of this invention uses a simple and unique circuit to combine two of such methods in an advantageous manner.

It is well known in the prior art that the gain of a field effect transistor which is biased near pinch-off may be reduced by reducing the source to gate voltage and thus driving the operating point of the FET into an area of decreasing gain. This has generally been accomplished in the prior art by varying the gate voltage, even though this introduces the necessity of an opposite polarity power supply to vary this voltage below ground and further may require adjustments or additional circuitry to take care of non-uniformity of pinch-off voltage in mass production. Prior art circuits in which the source voltage was varied in order to achieve gain control generally required a current source with a small impedance in the gain control circuit in order to supply sufficient current across the biasing resistor to raise the source voltage of the FET. However, the small impedance of the current source would serve as a shunt to RF signal even when gain reduction was not desired. If a higher impedance were used, however, undesirably high supply voltage was required. Therefore, the gate bias was usually varied in spite of its already mentioned difficulties.

In addition, the method of reducing gain by varying the source to gate voltage is limited in range by distortion due to overload as the gain is reduced, no matter which of the source or gate voltages is varied. This is due to the fact that, as input signal goes up in strength, AGC causes more gain reduction in the FET, so that at some point the FET becomes over-loaded by the strong input signal.

Another approach to gain control of a field effect transistor amplifier is to shunt a controllable portion of the input RF signal away from the amplifier. It is long been known that some semiconductor diodes exhibit dynamic impedance for radio frequency signals which varies with direct current therethrough. PIN diodes have been created to advantageously use this effect; and such diodes have been used in a shunt path for an RF amplifier as shown in the U.S. Pat. No. 4,019,160 to Kam. This method of gain control by itself, however, does not make full use of the gain control possibilities achievable with field effect transistors.

If the shunt path technique of gain control is used in combination with the pinch-off method described above, the former assists in reducing the overload problems of the latter by decreasing the input signal to the FET at the same time that the gain of the FET itself is reduced. This extends the AGC range of the FET as its overload characteristics are improved. If, in addition, the source to gate voltage could be controlled by varying the source voltage rather than the gate voltage, a simpler power supply could be used.

SUMMARY OF THE INVENTION

Therefore, it is an object of this invention to provide an FET amplifier utilizing both source to gate voltage control and input signal shunting to achieve gain control over a wide range with favorable overload characteristics.

It is another object of this invention to provide an FET amplifier in which gain is varied by varying the source voltage while holding the gate voltage constant so as to simplify the power supply.

It is a further object of this invention to provide an FET radio frequency amplifier in which one simple, controllable circuit means simultaneously provides a control of source to gate voltage and input signal shunting for control of gain in the FET.

These objects and others are realized in a common gate FET amplifier having a source bias resistor effective to bias the FET near pinch-off. A current source is connected through a diode to the FET source, the diode being of the type in which the RF impedance varies with DC current level therethrough. The current source is controllable in response to an AGC signal voltage to change the current through the diode. Thus, simultaneously, the changed current through the source bias resistor, and therefore the changed source voltage, changes the operating point of the FET relative to pinch-off; and the changed RF impedance of the diode varies the shunt of input signal from the FET. The diode provides simultaneous control of both gain altering functions to provide wide ranging gain control with good overload characteristics for the amplifier.

DESCRIPTION OF A PREFERRED EMBODIMENT

Referring to the FIGURE, an N-channel FET 10 has a grounded gate 11, a source 12 and a drain 13. Source 12 of FET 10 is connected to ground through a capacitor 15 and also through an inductor 16 and resistor 17 in series. The junction 18 of inductor 16 and resistor 17 provides a radio frequency input to the amplifier.

Drain 13 of FET 10 is connected through an inductor 20 to a source of current at a positive voltage $V_{DD}$, a tap 21 on inductor 20 providing a radio frequency output from the amplifier. Source $V_{DD}$ is also connected to the drain 13 of FET 10 through a capacitor 22 and is connected to ground through a capacitor 23.

Capacitor 15 and inductor 16 are provided for input impedance matching to, for example, an antenna; while inductor 20 and capacitor 22 are provided to tune the output to the amplifier. Capacitor 15 has a capacitance such that it is not an RF shunt to ground. In addition, inductor 16 does not block the RF signal from the source of FET 10. Capacitor 23 is provided as a bypass for RF signal around the power supply $V_{DD}$. Resistor 17 is a biasing resistor for the source 12 of FET 10 to establish the DC operating point of FET 10. Since the gate 11 of FET 10 is at a continual ground voltage level, the DC voltage at junction 18, applied through inductor 16 to the source 12 of FET 10, determines the source to gate voltage of FET 10 and therefore the DC operating point and gain. Resistor 17 is connected in a standard self-bias arrangement, so the source voltage will be above ground and therefore above the gate voltage. In the absence of an externally supplied bias voltage on source 12, resistor 17 will bias FET 10 near pinch-off so that an increase in voltage at junction 18 will shift the operating point of FET 10 into a region of decreasing gain.

A PNP bipolar transistor 30 has a collector connected through a capacitor 31 to ground and to the anode of a PIN diode 32, the cathode of which is connected to source 12 of FET 10. PIN 32 could be any diode having the characteristic that the RF dynamic impedance therethrough is controlled by the DC current therethrough. Capacitor 31 has a capacitance such that it is a shunt to ground at the frequency of frequencies of the received RF signal.

Transistor 30 has an emitter connected to the source of current at a supply voltage $V_{CC}$, which may be the same as $V_{DD}$, and also connected through a resistor 33 to the base of transistor 30. The base of transistor 30 is further connected through a resistor 34 to a source of AGC voltage. The source of AGC voltage is any appropriate AGC voltage source as shown in the prior art which is adapted to produce a positive AGC voltage which decreases with increasing input RF signal strength.

Transistor 30, in conjunction with resistors 33 and 34 and the biasing voltages, acts as a current source, the level of which current is controlled by the AGC voltage applied through resistor 34. As this voltage decreases from the level of $V_{CC}$, the current output from the collector of transistor 30 is increased and therefore so is the current through diode 32, inductor 16 and resistor 17. The increase in current through resistor 17 causes an increase in voltage at junction 18 to change the source to gate voltage of FET 10 and decrease the gain thereof. In addition, the increase in current through diode 32 causes a decrease in the radio frequency dynamic impedance so that a greater percentage of the input RF signal is shunted through diode 32 and capacitor 31 to ground. Thus, the current source of transistor 30 and the diode 32 simultaneously control the gain of FET 10 and the shunting of input signal from FET 10. As input RF signal strength increases, therefore, more of this RF signal is shunted from the source of FET 10 to provide additional gain reduction and a smaller FET input signal to prevent overload as the gain of FET 10 itself is reduced. The direct current flowing through PIN diode 32 controls both the source voltage of FET 10 and the dynamic RF impedance of PIN diode 32, so that the two effects work together with one control. The additional circuitry is simple and overcomes many of the problems with prior art circuits.

The circuit shown in the FIGURE and described above is only one of many equivalents which will occur to those skilled in the art. This invention should therefore be limited only by the claims which follow.

The embodiments of the invention in which an exclusive property or privilege is claimed are defined as follows:

1. A radio frequency amplifier with gain control comprising:
   a field effect transistor having source, gate and drain;
   means effective to bias the transistor as an amplifier with grounded gate, source input and drain output, said bias means including a bias resistor between source and ground effective to establish a source bias voltage to normally bias the field effect transistor near pinch-off;
   a current source;
   a diode having a dynamic impedance at radio frequencies which varies inversely with direct current therethrough, the diode having an anode connected to the current source flows and a cathode connected in series with the bias resistor, whereby increased current from the current source flows through the bias resistor, thus increasing the transistor source voltage and reducing amplifier gain, but whereby the diode prevents the current source from adversely affecting the amplifier input impedance;
   a radio frequency signal shunt coupled to the diode anode, whereby increasing direct current through from the current source through diode causes increasing shunt of input radio frequency signal away from the transistor source through the diode to provide further gain reduction and improve the amplifier overload characteristics.

2. A radio frequency amplifier with gain control comprising:
   a field effect transistor having source, gate and drain;
   means effective to bias the transistor as an amplifier with grounded gate, source input and drain output, said bias means including a bias resistor between source and ground effective to establish the source bias voltage to normally bias the field effect transistor near pinch-off;
   a current source including a bipolar transistor having a collector effective to supply the output current thereof;
   a PIN diode having a dynamic impedance at radio frequencies which varies inversely with direct current therethrough, the diode having an anode connected to the collector of the current source transistor to receive the current therefrom and a cathode connected in series with the bias resistor, whereby increased current from the current source transistor flows through the bias resistor, thus increasing the transistor source voltage and reducing amplifier gain, but whereby the diode prevents the current source from adversely affecting the amplifier input impedance;
   a capacitor connected between the PIN diode anode and ground and comprising a radio frequency signal shunt, whereby increasing direct current from the current source through the PIN diode causes increasing shunt of input radio frequency signal from the transistor source through the PIN diode and capacitor to provide further gain reduction and improve the amplifier overload characteristics.

* * * * *

UNITED STATES PATENT AND TRADEMARK OFFICE
CERTIFICATE OF CORRECTION

PATENT NO. : 4,243,947
DATED : January 6, 1981
INVENTOR(S) : Timothy P. Glennon

It is certified that error appears in the above—identified patent and that said Letters Patent is hereby corrected as shown below:

Column 3, line 6, "of" should read -- or --.

Column 4, claim 1, line 9, delete "flows".

Signed and Sealed this

Fourteenth Day of April 1981

[SEAL]

Attest:

RENE D. TEGTMEYER

Attesting Officer     Acting Commissioner of Patents and Trademarks